United States Patent
Hsu

(10) Patent No.: US 8,710,747 B2
(45) Date of Patent: Apr. 29, 2014

(54) VOLTAGE DETECTING DEVICE FOR LED DRIVER

(75) Inventor: Chi-Lin Hsu, New Taipei (TW)

(73) Assignee: Princeton Technology Corporation, New Taipei (TW)

( * ) Notice: Subject to any disclaimer, the term of this patent is extended or adjusted under 35 U.S.C. 154(b) by 98 days.

(21) Appl. No.: 13/458,375

(22) Filed: Apr. 27, 2012

(65) Prior Publication Data

US 2012/0274224 A1 Nov. 1, 2012

(30) Foreign Application Priority Data

Apr. 29, 2011 (TW) .............................. 100207618 U

(51) Int. Cl.
*H05B 37/02* (2006.01)

(52) U.S. Cl.
USPC ............................................................ 315/161

(58) Field of Classification Search
None
See application file for complete search history.

(56) References Cited

U.S. PATENT DOCUMENTS

| | | | | |
|---|---|---|---|---|
| 5,361,237 A | * | 11/1994 | Chishiki | 365/189.09 |
| 6,225,992 B1 | * | 5/2001 | Hsu et al. | 345/211 |
| 6,265,833 B1 | * | 7/2001 | Kim et al. | 315/169.3 |
| 6,433,458 B2 | * | 8/2002 | Nakatsuka et al. | 310/316.01 |
| 8,072,151 B2 | * | 12/2011 | Chang et al. | 315/177 |
| 8,237,368 B2 | * | 8/2012 | Lin et al. | 315/177 |
| 8,368,312 B2 | * | 2/2013 | Kim et al. | 315/185 R |
| 2007/0013318 A1 | * | 1/2007 | Toriumi et al. | 315/169.3 |
| 2011/0062872 A1 | * | 3/2011 | Jin et al. | 315/122 |
| 2011/0234104 A1 | * | 9/2011 | Mishima et al. | 315/129 |
| 2012/0146515 A1 | * | 6/2012 | Chuang et al. | 315/129 |
| 2012/0206055 A1 | * | 8/2012 | Tseng | 315/186 |

* cited by examiner

*Primary Examiner* — Crystal L Hammond

(74) *Attorney, Agent, or Firm* — Muncy, Geissler, Olds & Lowe, P.C.

(57) ABSTRACT

A voltage detecting device applied to a driving device of a light-emitting diode device is provided. The detecting device includes a voltage inspecting device, an isolating/connecting control device and a comparing device. The voltage inspecting device is coupled to an output terminal of the driving device to inspect a status of an output voltage of the driving device and outputs an inspecting signal. The isolating/connecting control device, coupled between the voltage inspecting device and the driving device, isolates or connects the output terminal of the driving device according to the inspecting signal. The comparing device, composed of low voltage elements, is coupled to the isolating/connecting control device, and compares the output voltage of the driving device with a reference voltage and generates a detecting signal according to the comparing result.

10 Claims, 4 Drawing Sheets

US 8,710,747 B2

VOLTAGE DETECTING DEVICE FOR LED DRIVER

CROSS REFERENCE TO RELATED APPLICATIONS

This Application claims priority of Taiwan Patent Application No.100207618, filed on Apr. 29, 2011, the entirety of which is incorporated by reference herein.

BACKGROUND OF THE INVENTION

1. Field of the Invention

The invention relates to detecting an output voltage of an LED driving device and more particularly to detecting an output voltage of a driving device that uses a constant current source to drive an LED.

2. Description of the Related Art

Ways to drive a light-emitting diode (LED) can be classified into three types: a constant voltage source type, a constant current source type and a pulse type. Advantages of the constant voltage source type driver are low costs and uncomplicated external circuitry; but, a disadvantage is luminance inconsistency of LEDs. Generally, the constant current source type driver can overcome the problem of luminance inconsistency of LEDs. For driving of the constant current source type driver, LEDs are connected in serial so as to assure the LEDs of luminance consistency. In addition, the constant current source type driver can avoid the condition where the reliability of the driving is influenced by the driving current when the driving current exceeds a largest rated value.

When an LED fails, the output voltage of the LED driving device is different from a normal operating voltage. Therefore, a voltage detecting device for detecting whether the output voltage of the LED driving device is normal or not is needed. Particularly, when the power of a system has to be lowered due to heat dissipating concerns, the voltage of power source is lowered. In the case, if the output voltage of the LED driving device is lower than a normal operating range, the output current may be abnormal, and the abnormal output current has to be detected.

FIG. 1 is a schematic diagram of an LED device showing a known way to detect an output voltage of a driving circuitry. The LEDs $LED_{1-N}$ are connected in serial and are coupled to an LED driving circuitry. The LED driving circuitry comprises a driving device 108 and a comparator CP1. In this way, an output terminal a of the driving device 108 of the LED driving circuitry is directly coupled to a negative terminal of the comparator CP1, so that the voltage of the output terminal a can be compared with a reference voltage VREF coupled to a positive terminal of the comparator CP1. When the voltage of the output terminal a is lower than the reference voltage VREF, a detecting signal Flag1 output by the comparator CP1 is at a high voltage level. The condition where the detecting signal Flag1 is at a high voltage level means that the voltage of the output terminal a of the driving device is too low and that the output current Iout may be abnormal.

In order to connect a plurality of LEDs in serial, a voltage VLED is usually much higher than voltage VDD. Therefore, when a pulse-width modulator PWM controls a switch Si to be off, the comparator CP1 has to be able to receive a high-voltage-level voltage. However, the area of the circuitry of the comparator CP1 is larger when using high voltage elements to realize the comparator CP1. Furthermore, an input offset voltage is higher. Therefore, the detecting way as shown in FIG. 1 is not accurate when detecting the voltage of the output terminal a of the driving device.

FIG. 2 is a schematic diagram of an LED device showing another known way to detect an output voltage of a driving circuitry. In this case, in order to use low voltage elements to realize the comparator CP2, the resistances R1 and R2 are used to divide voltage so as to divide the voltage of an output terminal b of a driving device 208 by (VLED/VSS). Accordingly, when the pulse-width modulator PWM controls a switch S2 to be off, voltage of a terminal c connected to a negative terminal of the comparator CP2 is ensured to be lower than or equal to the voltage VDD.

In the way shown in FIG. 2, though low voltage elements can be used to realize the comparator CP2 and thus the input offset voltage is smaller, the influence caused by the input offset is enlarged by (VLED/VSS) times. The greater the amount of LEDs, the higher the voltage VLED is, and thus the bigger the influence caused by the input offset is. In addition, there is also an error caused by mismatch of the resistances R1 and R2 in the way shown in FIG. 2.

BRIEF SUMMARY OF THE INVENTION

In view of this, the invention provides a voltage detecting device, applied to a driving device of a light-emitting diode device. The voltage detecting device uses a comparing device realized by low voltage elements to detect an output voltage of the driving device, so that a detecting error enlarged by voltage division of resistances is hindered.

The voltage detecting device comprises: a voltage inspecting device, coupled to an output terminal of the driving device to inspect a status of an output voltage of the driving device and outputting an inspecting signal; an isolating/connecting control device, coupled between the voltage inspecting device and the driving device, isolating or connecting the output terminal of the driving device according to the inspecting signal; and a comparing device, coupled to the isolating/connecting control device, comparing the output voltage of the driving device with a reference voltage and generating a detecting signal according to the comparing result. The comparing device is composed of low voltage elements.

Another embodiment of the invention provides a driving circuitry for light-emitting diode (LED) devices, comprising: a driving device, coupled to an LED device to drive the LED device; a voltage inspecting device, coupled to an output terminal of the driving device to inspect a status of an output voltage of the driving device and outputting an inspecting signal; an isolating/connecting control device, coupled between the voltage inspecting device and the driving device, isolating or connecting the output terminal of the driving device according to the inspecting signal; and a comparing device, coupled to the isolating/connecting control device, comparing the output voltage of the driving device with a reference voltage and generating a detecting signal according to the comparing result. The comparing device is composed of low voltage elements.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
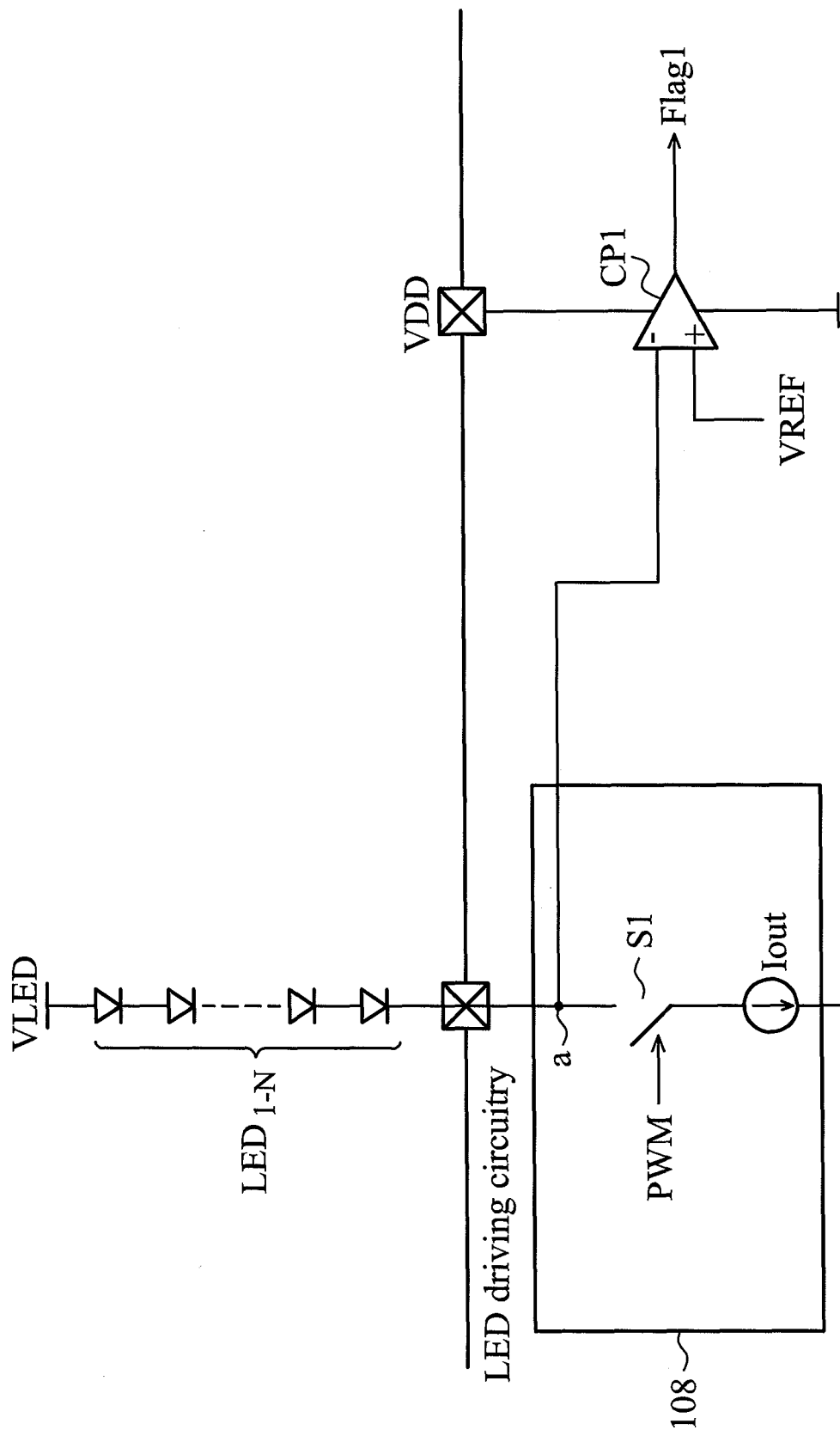
FIG. 1 is a schematic diagram of an LED device showing a known way to detect an output voltage of a driving circuitry.
Figure 2:
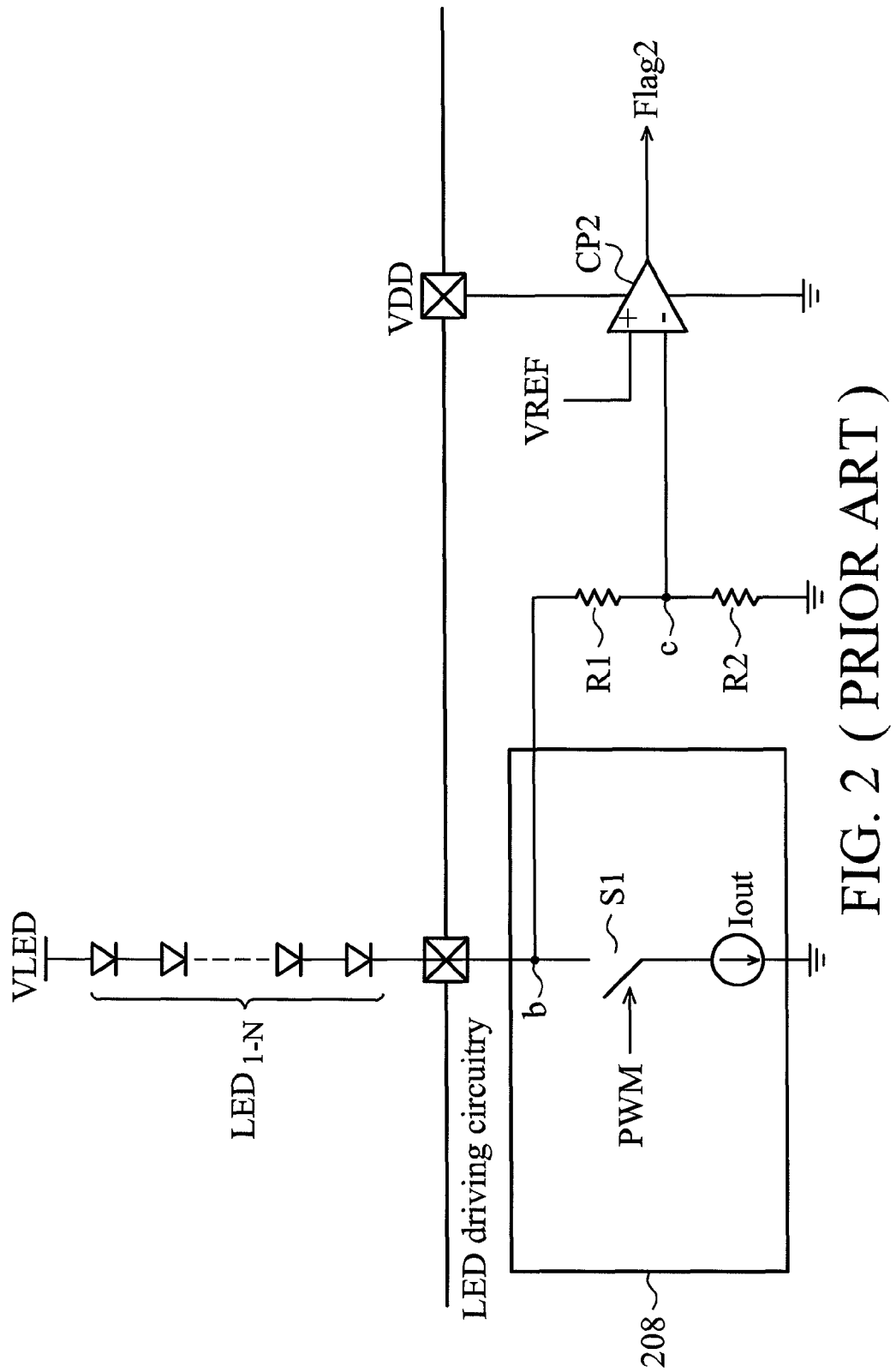
FIG. 2 is a schematic diagram of an LED device showing another known way to detect an output voltage of a driving circuitry.
Figure 3:
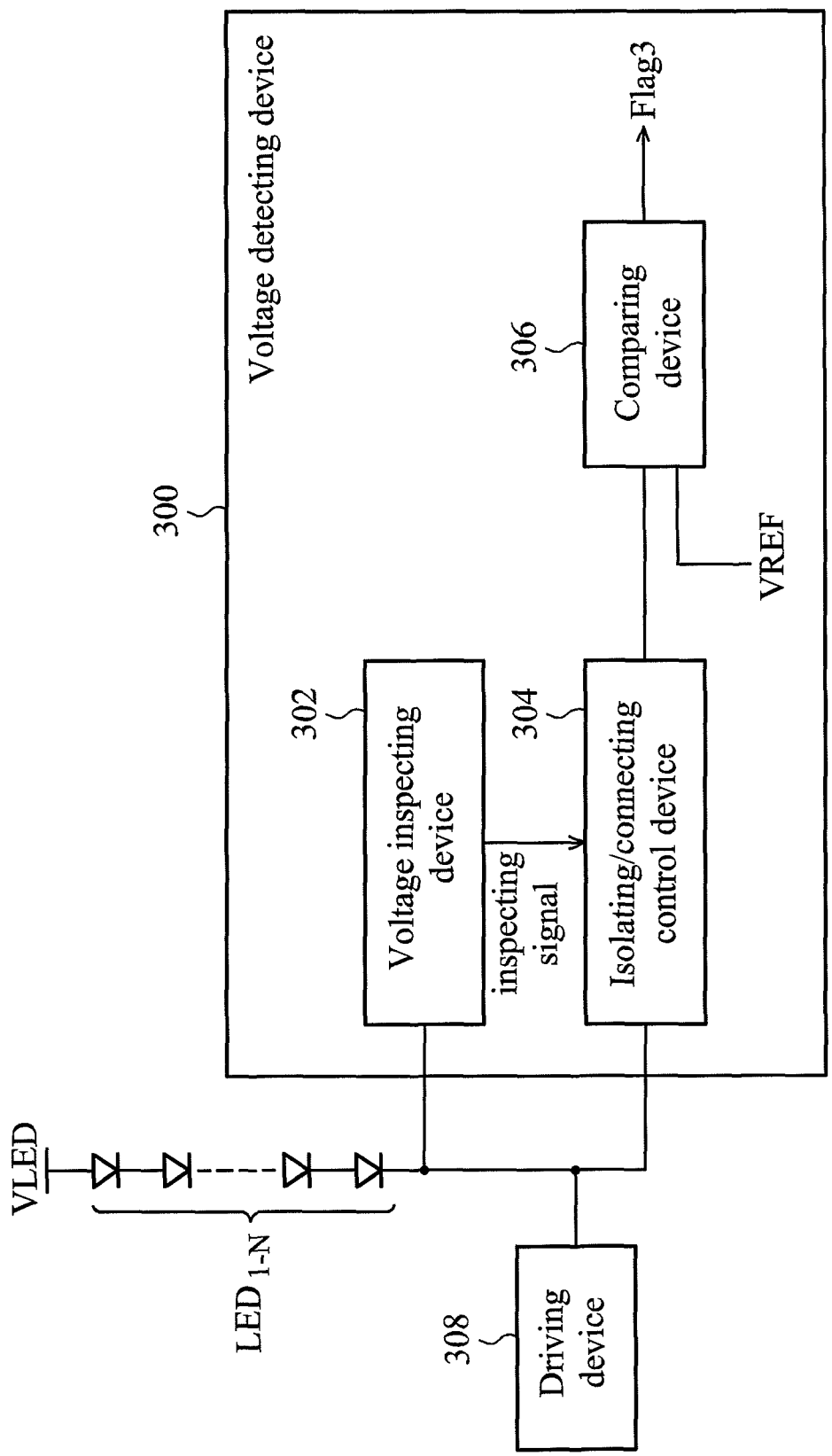
FIG. 3 shows a block diagram of a voltage detecting device applied to an LED driving device according to an embodiment of the invention.

As shown in FIG. 3, according to an embodiment of the invention, the voltage detecting device 300 comprises a voltage inspecting device 302 coupled to an output terminal of a driving device 308, a comparing device 306 composed of low voltage elements and an isolating/connecting control device 304 coupled between the output terminal of the driving device 308 and the comparing device 306. The voltage inspecting device 302 receives the voltage of the output terminal of the driving device 308 and outputs an inspecting signal. If the voltage of the output terminal of the driving device 308 is at a high voltage level, the inspecting signal is a second signal $\overline{SW}$. If the voltage of the output terminal of the driving device 308 is at a low voltage level, the inspecting signal is a first signal SW. The comparing device 306 compares the voltage of the output terminal of the driving device 308 with a reference voltage VREF and outputs a detecting signal Flag3 to determine whether the voltage of the output terminal of the driving device 308 is normal or not. The isolating/connecting control device 304 electrically isolates the comparing device 306 from the voltage of the output terminal of the driving device 308 or electrically connects the comparing device 306 with the voltage of the output terminal of the driving device 308 according to the inspecting signal output by the voltage inspecting device 302. If the inspecting signal is the second signal $\overline{SW}$, the isolating/connecting control device 304 electrically isolates the comparing device 306 from the voltage of the output terminal of the driving device 308 to prevent the comparing device 306 from being damaged by the high-voltage-level voltage of the output terminal. If the inspecting signal is the first signal SW, the isolating/connecting control device 304 electrically connects the comparing device 306 with the voltage of the output terminal of the driving device 308 to make the comparing device 306 compare the voltage of the output terminal with the reference voltage so as to determine whether the voltage of the output terminal is normal or not. When the voltage of the output terminal of the driving device 308 is at a high voltage level, since the isolating/connecting control device 304 electrically isolates the comparing device 306 from the voltage of the output terminal of the driving device 308, the comparing device 306 can be realized by low voltage elements. In one embodiment of the invention, the driving device 308 and the voltage detecting device 300 are packaged together or manufactured in the same integrated circuit.

Figure 4:
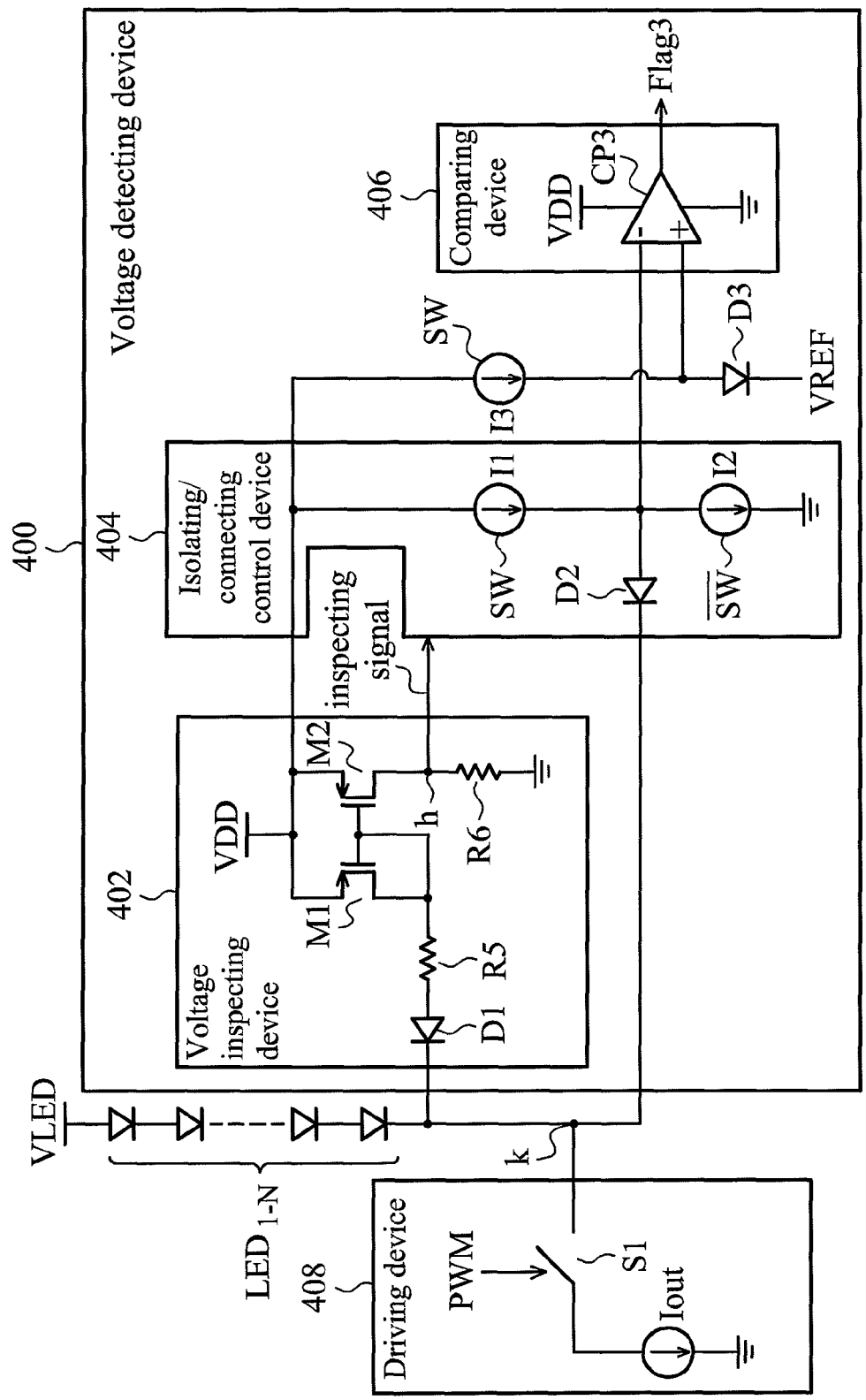
FIG. 4 shows a circuitry of a voltage detecting device applied to an LED driving device according to an embodiment of the invention.

Referring FIG. 4, a driving device 408 of the LED device $LED_{1-N}$ comprises a switch S1 controlled by a pulse-width modulator and a constant current source Iout. The pulse-width modulator (not shown in the Fig.) transmits a PWN control signal to control the switch S1 to be on or off. When the switch S1 is on, the constant current source Iout drives the LED device $LED_{1-N}$.

As shown in FIG. 4, in a voltage detecting device 400, a voltage inspecting device 402 comprises a diode D1 and transistors M1 and M2. A cathode of the diode D1 is coupled to an output terminal k of the driving device 408. Sources of the transistors M1 and M2 are connected to a power supply source VDD. Gates of the transistors M1 and M2 are connected together. A drain of the transistor M1 is coupled to the gate of the transistor M1 and is further coupled to an anode of the diode D1 through a resistance R5. A drain of the transistor M2 is grounded through a resistance R6. The drain of the transistor M2 is further coupled to an inspecting signal of the voltage inspecting device 402. An isolating/connecting control device 404 comprises an isolating diode D2 and a controllable current source I1 and a controllable current source I2. A cathode of the isolating diode D2 is coupled to a negative input terminal of a comparator CP3 of a comparing device 406. The voltage detecting device 400 further comprises a compensating diode D3 and a controllable current source I3. An anode of the compensating diode D3 is coupled to the controllable current source I3 and a positive input terminal of the comparator CP3 of the comparing device 406. A cathode of the compensating diode D3 is coupled to the reference voltage VREF. The compensating diode D3 matches the isolating diode D2. The output current of the controllable current source I3 is equal to the output current of the controllable current source I1.

When the switch S1 of the driving device 408 is off, the LED device $LED_{1-N}$ is not driven, and the voltage of the output terminal k of the driving device 408 is pulled up to the voltage VLED. Therefore, the diode D1 is off. Because the diode D1 is off, the voltage of the drain terminal h of the transistor M2 is pulled down. At the same time, the voltage inspecting device 402 outputs the inspecting signal $\overline{SW}$. The inspecting signal $\overline{SW}$ makes the controllable current source I2 to be on and the controllable current source I1 to be off. Since the controllable current source I2 is on, the voltage of the anode of the isolating diode D2 is pulled down to be grounded by the turned-on controllable current source I2, and thus the isolating diode D2 is off. At the time, the output terminal k of the driving device 408 is isolated from the comparing device 406 by the turned-off isolating diode D2. Therefore, the comparing device 406 is not damaged by the high-voltage-level voltage of the output terminal k of the driving device 408. Accordingly, the comparing device 406 can be realized by low voltage elements.

When the switch S1 of the driving device 408 is on, the LED device $LED_{1-N}$ is driven, and the voltage of the output terminal k of the driving device 408 is pulled down. Therefore, the diode D1 is on. Because the diode D1 is on, the voltage of the drain terminal h of the transistor M2 is pulled up. At the same time, the voltage inspecting device 402 outputs the inspecting signal SW. The inspecting signal SW makes the controllable current source I1 to be on and the controllable current source I2 to be off. Since the controllable current source I1 is on, the voltage of the negative input terminal of the comparator CP3 is equal to a sum of the voltage of the output terminal k of the driving device 408 and the voltage of the turned-on isolating diode D2. At the same time, the inspecting signal SW controls the controllable current source I3 to make the controllable current source I3 to be on. Therefore, the voltage of the positive input terminal of the comparator CP3 is equal to a sum of the reference voltage VREF and the voltage of the turned-on compensating diode D3. Since the compensating diode D3 matches the isolating diode D2 and the output current of the controllable current source I3 is equal to the output current of the controllable current source I1, the voltage of the turned-on isolating diode D2 is equal to the voltage of the turned-on compensating diode D3. Therefore, the comparator CP3 can compare the voltage of the output terminal k of the driving device 408 with the reference voltage VREF. When the voltage of the output terminal k of the driving device 408 is lower than the reference voltage VREF, the detecting signal Flag3 output by the comparator CP3 is at a high voltage level. In this case, the voltage of the output terminal k of the driving device 408 being too low is detected and the output current Iout may be abnormal.

In one embodiment of the invention, the driving device 408 and the voltage detecting device 400 are packaged together or manufactured in the same integrated circuit.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A voltage detecting device, applied to a driving device of a light-emitting diode device, wherein the voltage detecting device comprises:
    a voltage inspecting device, coupled to an output terminal of the driving device, to inspect a status of an output voltage of the driving device and output an inspecting signal;
    an isolating/connecting control device, coupled between the voltage inspecting device and the driving device, isolating or connecting the output terminal of the driving device according to the inspecting signal; and
    a comparing device, coupled to the isolating/connecting control device, comparing the output voltage of the driving device with a reference voltage and generating a detecting signal according to the comparing result,
    wherein the comparing device is composed of low voltage elements.

2. The voltage detecting device as claimed in claim 1, wherein the isolating/connecting control device comprises:
    an isolating diode, wherein an anode and a cathode of the isolating diode are respectively connected to a first input terminal of the comparing device and the output terminal of the driving device;
    a first controllable current source, connected to the anode of the isolating diode, wherein the first controllable current source is controlled by a first signal to provide a current flowing into the anode of the isolating diode; and
    a second controllable current source, connected to the anode of the isolating diode, wherein the second controllable current source is controlled by a second signal to lower a voltage level of the anode of the isolating diode so as to turn the isolating diode off.

3. The voltage detecting device as claimed in claim 2, further comprising:
    a compensating diode, wherein an anode and a cathode of the compensating diode are respectively connected to a second input terminal of the comparing device and the reference voltage; and
    a third controllable current source, connected to the anode of the compensating diode, wherein the third controllable current source is controlled by the first signal to provide a current flowing into the anode of the compensating diode,
    wherein the compensating diode matches the isolating diode, and an output current of the third controllable current source is equal to an output current of the first controllable current source.

4. The voltage detecting device as claimed in claim 2, wherein when voltage of the output terminal of the driving device is a first voltage, the voltage detecting device outputs the first signal, and when the voltage of the output terminal is a second voltage, the voltage detecting device outputs the second signal, wherein the second voltage has a higher voltage level than the first voltage.

5. The voltage detecting device as claimed in claim 4, wherein the isolating/connecting control device receives an output of the voltage detecting device, and when the isolating/connecting control device receives the second signal, the isolating/connecting control device electrically isolates the output terminal of the driving device from the comparing device to prevent the comparing device from being damaged by the second voltage, and when the isolating/connecting control device receives the first signal, the isolating/connecting control device electrically connects the output terminal of the driving device to the comparing device to make the comparing device compare the first voltage with the reference voltage.

6. A driving circuitry for light-emitting diode (LED) devices, comprising:
    a driving device, coupled to an LED device to drive the LED device;
    a voltage inspecting device, coupled to an output terminal of the driving device to inspect a status of an output voltage of the driving device and output an inspecting signal;
    an isolating/connecting control device, coupled between the voltage inspecting device and the driving device, isolating or connecting the output terminal of the driving device according to the inspecting signal; and
    a comparing device, coupled to the isolating/connecting control device, comparing the output voltage of the driving device with a reference voltage and generating a detecting signal according to the comparing result,
    wherein the comparing device is composed of low voltage elements.

7. The driving circuitry as claimed in claim 6, wherein the isolating/connecting control device comprises:
    an isolating diode, wherein an anode and a cathode of the isolating diode are respectively connected to a first input terminal of the comparing device and the output terminal of the driving device;
    a first controllable current source, connected to the anode of the isolating diode, wherein the first controllable current source is controlled by a first signal to provide a current flowing into the anode of the isolating diode; and
    a second controllable current source, connected to the anode of the isolating diode, wherein the second controllable current source is controlled by a second signal to lower a voltage level of the anode of the isolating diode so as to turn the isolating diode off.

8. The driving circuitry as claimed in claim 7, further comprising:
    a compensating diode, wherein an anode and a cathode of the compensating diode are respectively connected to a second input terminal of the comparing device and the reference voltage; and
    a third controllable current source, connected to the anode of the compensating diode, wherein the third controllable current source is controlled by the first signal to provide a current flowing into the anode of the compensating diode, wherein the compensating diode matches the isolating diode, and an output current of the third controllable current source is equal to an output current of the first controllable current source.

9. The driving circuitry as claimed in claim 7, wherein when voltage of the output terminal of the driving device is a first voltage, the voltage detecting device outputs the first signal, and when the voltage of the output terminal is a second voltage, the voltage detecting device outputs the second signal, wherein the second voltage has a higher voltage level than the first voltage.

10. The driving circuitry as claimed in claim 9, wherein the isolating/connecting control device receives an output of the voltage detecting device, and when the isolating/connecting control device receives the second signal, the isolating/connecting control device electrically isolates the output terminal of the driving device from the comparing device to prevent the comparing device from being damaged by the second voltage, and when the isolating/connecting control device receives the first signal, the isolating/connecting control device electrically connects the output terminal of the driving device to the comparing device to make the comparing device compare the first voltage with the reference voltage.

* * * * *